United States Patent [19]

Torii et al.

[11] Patent Number: 4,994,437
[45] Date of Patent: Feb. 19, 1991

[54] METHOD OF MANUFACTURING OXIDE SUPERCONDUCTING FILMS BY PERITECTIC REACTION

[75] Inventors: Yasuko Torii; Yasuo Namikawa; Masami Tatsumi, all of Osaka, Japan

[73] Assignee: Sumitomo Electric Industries, Ltd., Osaka, Japan

[21] Appl. No.: 276,725

[22] Filed: Nov. 28, 1988

[30] Foreign Application Priority Data

Nov. 26, 1987 [JP] Japan .................................. 62-301073
Jan. 30, 1988 [JP] Japan .................................. 63-19763
Feb. 15, 1988 [JP] Japan .................................. 63-30916
Feb. 18, 1988 [JP] Japan .................................. 63-34032

[51] Int. Cl.$^5$ .......................... B05D 5/12; B05D 1/18
[52] U.S. Cl. ......................................... 505/1; 505/733; 505/730; 427/62; 427/169; 427/443.2; 427/430.1
[58] Field of Search ............... 427/62, 63, 169, 443.2, 427/430.1; 505/1, 733, 730; 156/600, 616.1; 423/593; 501/152

[56] References Cited

U.S. PATENT DOCUMENTS

4,115,604  9/1978  Beinstein ............................. 427/329

FOREIGN PATENT DOCUMENTS

281753  1/1988  European Pat. Off. .

OTHER PUBLICATIONS

Oka et al., "Phase Diagram of the $La_2O_3$—CuO System and Crystal Growth of $(LaBa)_2CuO_4$", Jpn. J. Appl. Phys., vol. 26(10) Oct. 1987, L1590–L1592.

Hermann et al., "Melt-Processible Rare Earth—Ba—Cu—O Superconductors Based on Molten Ba—Cu Oxides", Appl. Phys. lett., 51 (22) Nov. 1987, pp. 1854–1856.

Jin et al., "High Critical Current in Y—Ba—Cu—O", Superconductors, Appl. Phys. Lett. 52 (24) Jun. 1988, pp. 2074–2076.

Takada et al., "$Ba_2YCu_3O_x$ Crystal Formed by Peritectic Reaction", Jpn. J. Appl. Phys. 26(10) Oct. 1987, L1707–L1710.

Jin et al., "Fabrication of Dense $Ba_2YCu_3O_{7-\delta}$ Superconductor Wire by Molten Oxide Processing", Appl. Phys. Lett. 51 (12) Sep. 1987, p. 943.

Japanese Journal of Applied Physics, vol. 26, pp. L812–L814, May, 1987, S. Ohshima et al.

Primary Examiner—Norman Morgenstern
Assistant Examiner—Roy V. King
Attorney, Agent, or Firm—Pennie & Edmonds

[57] ABSTRACT

A method of manufacturing an oxide superconductor by heating a raw material for an oxide superconductor composed of $MBa_2Cu_3O_{7-\delta}$, where M represents at least a single element selected from a group of Y, Nd, Sm, Eu, Gd, Dy, Ho, Er, Tm, Yb and Lu, to a temperature higher than a peritectic reaction temperature for melting the same and thereafter reducing the temperature to the peritectic reaction temperature to crystallize the oxide superconductor by peritectic reaction. A method of forming a dispersion solution of powder of a raw material for an oxide superconductor and applying the same on a substrate to prepare a thick film. A method of dipping a single crystal of $M_2BaCuO_5$ in a molten solution of a mixture of $BaCuO_2$ and CuO to form a thin film of an oxide superconductor on the single crystal. A method of manufacturing a bulky oxide superconductor by dipping a porous sintered material of $M_2BaCuO_5$ in a molten solution of a mixture of $BaCuO_2$ and CuO.

12 Claims, 4 Drawing Sheets

METHOD OF MANUFACTURING OXIDE SUPERCONDUCTING FILMS BY PERITECTIC REACTION

BACKGROUND OF THE INVENTION

1. Field of the Invention

The present invention relates to a method of manufacturing an oxide superconductor.

2. Description of the Prior Art

A superconductive material composed of $YBa_2Cu_3O_{7-\delta}$, which shows superconductivity at a high temperature of about 90° K, is expected for various uses. For example, such a superconductive material can be applied to power transmission, in order to extremely reduce power loss of about 7% caused by transmission. With respect to a use as an electromagnet, studied is application to nuclear fusion, SOR, an accelerator, a magnetic levitation train, NMR-CT, an electromagnetically driven ship or the like.

In application to such usage, it is preferable to work the superconductive material having the aforementioned composition into the form of a bulk material, a wire rod, a tape or the like. In this case, a value generally obtained as critical current density Jc is about $10^3$ to $10^4$ A/cm² at the liquid nitrogen temperature of 77° K. However, it is said that critical current density Jc of at least $10^6$ A/cm² is required for practical use such as power transmission or application to an electromagnet.

A bulk oxide superconductor has been mainly manufactured by a solid phase reaction method or a coprecipitation method.

Powder of the aforementioned yttrium oxide superconductive material is generally synthesized by the solid phase reaction method.

A $YBa_2Cu_3O_{7-\delta}$ material is prepared by the sintering method as follows:

First, $BaCO_3$, $Y_2O_3$ and $CuO$ are weighted as starting materials in the ratios Y:Ba:Cu=1:2:3, and mixed in a mortar. Powder of such a mixture is heated/reacted within an alumina crucible in an oxygen flow or in the atmosphere at 930° to 950° C. for 8 to 12 hours. Then the powder is ground and pelletized, which is sintered in the air or in an oxygen flow of 900° to 950° C. for 12 to 24 hours, and then subjected to furnace cooling.

In the coprecipitation method, reagents such as oxalate, carbonate and citrate are employed to synthesize $YBa_2Cu_3O_{7-\delta}$ through thermal decomposition of such reagents.

Another oxide superconductor expressed as $MBa_2Cu_3O_{7-\delta}$, where M represents at least a single element selected from a group of Nd, Sm, Eu, Gd, Dy, Ho, Er, Tm, Yb and Lu, is also prepared by a substantially similar synthesizing method.

A vapor phase growth method has been conventionally reported as a method of preparing a thin film of an oxide superconductor. For example, there are reports that an oxide thin film has been formed by molecular beam epitaxy (MBE) to obtain a thin film having b and c axes oriented in surfaces, that a thin film of 1 μm in thickness has been grown on an $SrTiO_3$ substrate by a three-gun vapor deposition method, and the like.

In the conventional solid phase reaction method, powder materials are mixed with each other in a mortar. However, the degree of such mixing is to about the size of the starting particles at the most, and homogenous dispersion is limited. Further, since solid phase reaction progresses only in the vicinity of contact points between particles, such reaction must be repeated in order to obtain a $YBa_2Cu_3O_{7-\delta}$ phase. In addition, the obtained sample is porous and its density is merely about 70 to 80% of a theoretical value.

In a conventional method of manufacturing an oxide superconductor by the vapor phase growth method, on the other hand, manufacturing steps are complicated and the growth rate of a film is slow, leading to inferior productivity. In the conventional method, further, such a problem is particularly caused in density that a body obtained is considerably porous with density similar to that of a sintered material, and a critical current value is reduced as the result.

SUMMARY OF THE INVENTION

An object of the present invention is to provide a method of manufacturing an oxide superconductor, which can manufacture a homogenously composed oxide superconductor being superior in density and crystallinity to the prior art through relatively simple steps.

The present invention is directed to a method of manufacturing an oxide superconductor which is crystallized through peritectic reaction by heating the material therefor to a temperature higher than a peritectic reaction temperature for melting the same and then cooling the melt to the peritectic reaction temperature, thereby to crystallize the oxide superconductor thus obtained through peritectic reaction.

According to the present invention, the material is temporarily heated to a temperature higher than the peritectic reaction temperature to be in a molten state, whereby rapid and homogenous reaction can be attained as compared with solid phase reaction which is caused only in grain boundaries.

According to a first aspect of the present invention, the method comprises a step of heating a raw material for an oxide superconductor crystallized by peritectic reaction to a temperature higher than a peritectic reaction temperature for melting the same, a step of cooling the melt to the peritectic reaction temperature and retaining the said temperature for a constant period to facilitate peritectic reaction thereby to crystallize an oxide superconductor thus obtained, and a step of gradually cooling the oxide superconductor to the room temperature.

A typical oxide superconductor which is crystallized by peritectic reaction is composed of $MBa_2Cu_3O_{7-\delta}$, where M represents at least a single element selected from a group of Y, Nd, Sm, Eu, Gd, DY, Ho, Er, Tm, Yb and Lu.

The peritectic reaction temperature can be obtained by differential thermal analysis. For example, $MBa_2Cu_3O_{7-\delta}$ is decomposed by peritectic reaction into $M_2BaCuO_5$, $CuO$ and $BaCuO_2$. The peritectic reaction temperature can be evaluated/decided by identifying a phase around a peak by differential thermal analysis. This peritectic reaction temperature is decided to be within a range of Tp±30° C., assuming that Tp represents the rise temperature of the differential thermal peak. According to the first aspect of the present invention, therefore, the melt is retained at a constant temperature within a temperature region causing appearance of the peritectic reaction peak, i.e., a temperature region between leading and trailing edges of the peak.

Figure 1:
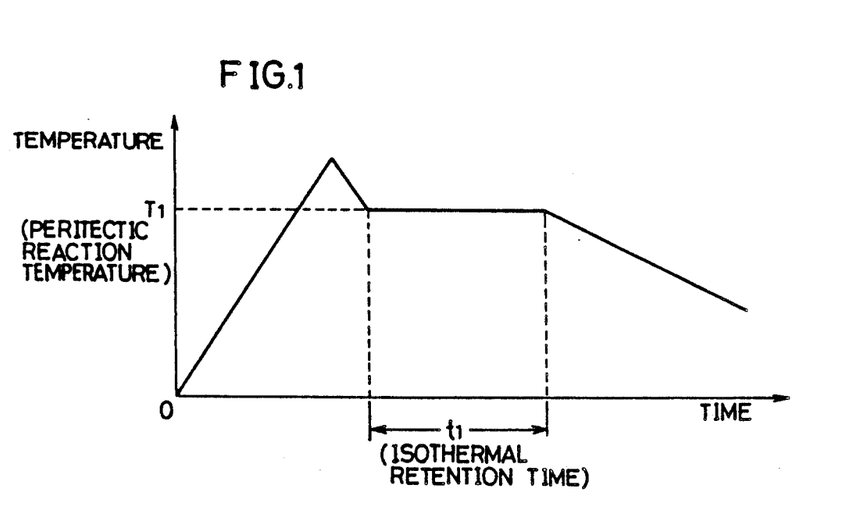
FIG. 1 illustrates a heating/cooling curve according to a first aspect of the present invention.

FIG. 1 illustrates a heating/cooling curve according to the first aspect of the present invention. As shown in FIG. 1, the material is temporarily heated to a temperature higher than a peritectic reaction temperature $T_1$ to be molten, and a melt thus obtained is cooled to the peritectic reaction temperature $T_1$ and retained at this temperature $T_1$ for a period $t_1$, to crystallize an oxide superconductor. Then the oxide superconductor is gradually cooled to the room temperature.

According to the first aspect of the present invention, the peritectic reaction temperature is preferably retained for 1 to 20 hours. The speed for cooling the oxide superconductor is preferably not more than 300° C./hr.

The raw material for the oxide superconductor employed in the first aspect may already have the composition of the oxide superconductor, or may be prepared from oxides of respective elements previous to composition. Even if a sintered material already having the composition of the oxide superconductor is employed as a starting material, there is no need to homogenize the same by repeating solid phase reaction, dissimilarly to the prior art. According to the present invention, progress of reaction is rapid and homogenous as compared with solid phase reaction, due to provision of the step of melting the raw material for the oxide superconductor.

In more concrete terms, peritectic reaction of $MBa_2Cu_3O_{7-\delta}$ is so utilized in the first aspect of the present invention as to cool the same from a temperature region provided with a hot-side liquid phase and isothermally retain the same in the vicinity of a peritectic reaction temperature, thereby to obtain $MBa_2Cu_3O_{7-\delta}$ having high crystallinity. $MBa_2Cu_3O_{70-\delta}$ can be stably obtained in a single phase by retarding the cooling rate.

According to the first aspect of the present invention, the oxide superconductor has higher crystal density as compared with that obtained by solid phase reaction, due to provision of the melting step.

According to a second aspect of the present invention, the method comprises a step of dispersing powder of a raw material for an oxide superconductor composed of $MBa_2Cu_3O_{7-\delta}$, where M represents at least a single element selected from a group of Y, Nd, Sm, Eu, Gd, Dy, Ho, Er, Tm, Yb and Lu, in a dispersion medium, a step of applying the dispersion solution on a substrate and heating the dispersion solution applied on the substrate to a temperature higher than a peritectic reaction temperature of the oxide superconductor in an oxygen atmosphere for melting the same, a step of reducing the temperature of the melt on the substrate to the peritectic reaction temperature and retaining the said temperature for a constant period to facilitate peritectic reaction for attaining crystallization, thereby to form a thick film of the oxide superconductor on the substrate, and a step of gradually cooling the thick film of the oxide superconductor to the room temperature.

In the second aspect of the present invention, the peritectic reaction temperature is preferably within a range of a rise temperature Tp of a differential thermal peak of the raw material powder, measured through differential thermal analysis, ±30° C.

In the melting step, the upper limit of the heating temperature is preferably higher by 100° C. than the rise temperature Tp of the differential thermal peak of the raw material powder measured through differential thermal analysis. Further, the cooling step is preferably carried out at a cooling rate of not more than 300° C./hr.

The raw material powder employed in the second aspect of the present invention may already have the composition of the oxide superconductor, or may be prepared from mixed powder of oxides of respective elements previous to composition.

The method according to the second aspect of the present invention is now described in more concrete terms.

First, a sintered material of $MBa_2Cu_3O_{7-\delta}$, which causes peritectic reaction, is prepared as a starting material. This powder sample is subjected to differential thermal analysis, to measure a rise temperature Tp of a differential thermal peak. A peritectic reaction temperature is decided to be within a range of the temperature Tp±30° C. A temperature to be employed in a melting step is so set that the same exceeds the peritectic reaction temperature and the upper limit thereof is higher by 100° C. than the temperature Tp.

Then, the starting material powder is mixed with a dispersion medium to be dispersed, and the dispersion solution is applied on a single crystal substrate by screen printing. This substrate is introduced into a furnace to be heated to the aforementioned upper limit temperature under an oxygen atmosphere and retained for a constant period. Thus, rightward reaction in the following formula (I) is completed:

$2MBa_2Cu_3O_{7-\delta}$ (solid phase) $= M_2BaCuO_5$ (solid phase) $+ 3BaCuO_2$ (liquid phase) $+ 2CuO$ (liquid phase)  (I)

Thereafter the temperature is reduced to the peritectic reaction temperature and retained for a constant period to facilitate peritectic reaction, which is leftward reaction in the above formula (I), thereby to generate a superconducting phase of prescribed thickness. Then, the superconducting phase is gradually cooled to the room temperature at a cooling rate of not more than 300° C./hr.

Figure 2:
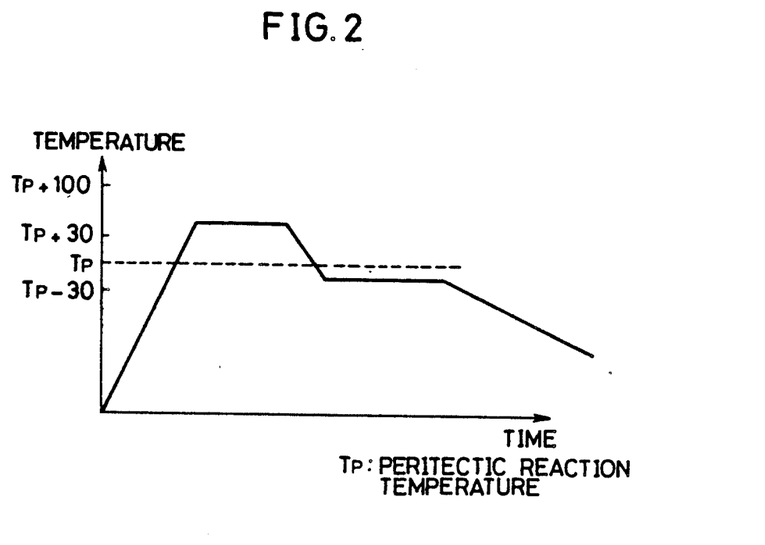
FIG. 2 illustrates a heating/cooling curve according to a second aspect of the present invention.

FIG. 2 illustrates a heating/cooling curve according to the second aspect of the present invention. As shown in FIG. 2, raw material powder is first temporarily heated to a temperature higher than Tp+30° C. but lower than Tp+100° C., to cause decomposition/melting reaction of the raw powder material, which is applied on a substrate, at a high temperature exceeding the peritectic reaction temperature. The material is thus passed through a liquid-phase state, then cooled to a temperature around Tp ±30° C. and retained at this temperature for a constant period, thereby to facilitate peritectic reaction. Also in the second aspect of the present invention, a thick film thus obtained has dense structure since the same is passed through the liquid-phase state, to be improved in superconductivity, particularly in current density. Further, the aforementioned decomposition/melting reaction is reversible to peritectic reaction, whereby the starting raw material and the film formed thereof are identical in composition to each other. Thus, the composition can be easily controlled.

The superconductor thick film can be oriented by employing a single crystal such as MgO, $SrTiO_3$ or YSZ (yttrium stabilized zirconia) for the substrate, whereby critical current density is further improved.

According to a third aspect of the present invention, the method comprises a step of heating a mixture of $BaCuO_2$ and CuO in an oxygen atmosphere for melting the same and a step of dipping a single crystal material composed of $M_2BaCuO_5$, where M represents at least a single element selected from a group of Y, Nd, Sm, Eu, Gd, Dy, Ho, Er, Tm, Yb and Lu, in a molten solution to form a thin film of an oxide superconductor composed of $MBa_2Cu_3O_{7-\delta}$ on the surface of the single crystal material by peritectic reaction.

In the third aspect of the present invention, it has been confirmed that $MBa_2Cu_3O_{7-\delta}$ is most rapidly generated when the mole composition ratio of $BaCuO_2$ to CuO contained in the raw material molten solution is 3:2. It has been also confirmed that superconductivity is improved by annealing the thin film formed on a substrate surface in an oxygen atmosphere of 850° to 900° C. for at least three hours.

$MBa_2Cu_3O_{7-\delta}$ causes phase transition depending on density of oxygen, i.e., the value $\delta$. It enters rhombic structure in a range of $0 \leq \delta \lesssim 0.5$, while entering tetragonal structure in a range of $\delta \lesssim 0.5$. A range of $\delta < 0.2$ is preferable particularly in consideration of characteristics such as Tc, $\Delta$Tc, Jc and the like.

The oxide superconductor composed of $MBa_2Cu_3O_{7-\delta}$ is heated to a high temperature, to cause decomposition/melting reaction as shown in the aforementioned formula (I). The reaction system expressed in the formula (I) is peritectic reaction as hereinabove described, which reaction is caused at a temperature lower than that for melting a simple substance of CuO or $BaCuO_2$.

According to the third aspect of the present invention, a substrate of a single crystal material of $M_2BaCuO_5$ is brought into contact with a raw material molten solution formed of a mixture of $BaCuO_2$ and CuO to facilitate leftward reaction in the above formula (I), thereby to form a dense thin film of $MBa_2Cu_3O_{7-\delta}$ on the single crystal surface of $M_2BaCuO_5$. This reaction is liquid-phase reaction, the growth rate of which is extremely high as compared with that of the conventional vapor phase growth method, while operation for such growth is simple. The thin film formed on the substrate, which is raised up from the raw material molten solution, can be further annealed in an oxygen atmosphere of 850° to 900° C. for at least three hours, thereby to improve superconductivity.

Thus, according to the third aspect of the present invention, an oxide superconductor can be relatively easily manufactured at a high growth rate, to reduce the manufacturing cost. A thin film substrate manufactured by the method according to the present invention can be applied to a substrate for a superconducting device, for example.

According to a fourth aspect of the present invention, the method comprises a step of heating a mixture of $BaCuO_2$ and CuO in an oxygen atmosphere for melting the same and a step of dipping a porous sintered material composed of $M_2BaCuO_5$, where M represents at least a single element selected from a group of Y, Nd, Sm, Eu, Gd, Dy, Ho, Er, Tm, Yb and Lu, in the said molten solution to form an oxide superconductor having composition of $MBa_2Cu_3O_{7-\delta}$ through peritectic reaction.

The sintered material of $M_2BaCuO_5$ can be obtained by pelletizing powder and thermally treating the same at a high temperature. This sintered material is obtained as a porous one, since it is impossible to obtain a completely dense material. Such a porous sintered material is so dipped in a molten solution that the molten solution is sucked up into the sintered material by a capillary phenomenon, to cause peritectic solidification reaction in the above reaction formula (I) over the entire region of the sintered material. Thus, the reaction smoothly progresses when powder forming the raw material for the sintered material has small particle size, while it is difficult to obtain a single phase of $MBa_2Cu_3O_{7-\delta}$ when the said particle size is large, since $M_2BaCu_5$ is left in $MBa_2Cu_3O_{7-\delta}$.

$MBa_2Cu_3O_{7-\delta}$ is grown from surfaces to interiors of $M_2BaCuO_5$ fine particles by peritectic reaction, while surrounding the liquid phase to be grown toward the outside. Thus, porosity of the sintered material of $M_2BaCuO_5$, serving as the raw material, is adjusted to be optimum so that adjacent particles of $MBa_2Cu_3O_{7-\delta}$ are completely adhered to each other upon completion of the peritectic reaction, to provide a bulky polycrystalline substance having dense structure.

The sintered material of $M_2BaCuO_5$ is thus adjusted in particle size and porosity, to quickly obtain a dense bulky polycrystalline substance of $MBa_2Cu_3O_{7-\delta}$. It has been clarified through the result of an experiment that the particle size is preferably not more than 0.5 $\mu$m and porosity is preferably within a range of 5 to 30%. If the particle size is larger than 0.5 $\mu$m, $M_2BaCuO_5$ is left in the interior of $MBa_2Cu_3O_{7-\delta}$ to require a long time for obtaining a complete single phase, which may not be obtained as the case may be. If porosity is smaller than 5%, a solid phase of $M_2BaCuO_5$ may be left and a single phase cannot be obtained after pores are completely filled up with progress of reaction. If porosity is larger than 30%, on the other hand, pores filled with the molten solution of the mixture of $BaCuO_2$ and CuO may be left after completion of the reaction with disappearance of the phase of $M_2BaCuO_5$, to disable formation of a single phase.

The mixing ratio of $BaCuO_2$ to CuO is preferably 3:2 in mole ratio. If the mixing ratio is not 3:2, the molten solution sucked up into the interior of the sintered material of $M_2BaCuO_5$ by the capillary phenomenon may not be completely removed through the leftward reaction in the above formula (I), i.e., peritectic solidification reaction, and hence excessive components with respect to the mole ratio 3:2 may be left to disable formation of a single phase. Thus, the mixing ratio of $BaCuO_2$ to CuO is preferably that corresponding to stoichiometric composition of the formula (I), i.e., 3:2.

Strictly speaking, a temperature for retaining the molten solution, in which the sintered material is dipped, is varied with elements. However, a peritectic solidification temperature is within a range of 1000° to 1100° C. for any element. The temperature for retaining the molten solution, which is preferably lower by about 0° to 100° C. than the peritectic solidification temperature, is preferably 900° to 1100° C.

The time for dipping the sintered material in the molten solution and retaining the same is varied with the temperature for retaining the molten solution, the particle size of the sintered material and the like. However, the reaction can be generally completed in about five minutes to 10 hours.

According to the fourth aspect of the present invention, an extremely dense bulky superconductive oxide having excellent characteristics can be manufactured through relatively simple steps. Further, a wire rod, a coil or the like can be obtained as a dense superconductor having high critical current density. Thus, the method according to the fourth aspect of the present invention is applicable in various fields to a transmission cable, a medical coil and the like.

These and other objects, features, aspects and advantages of the present invention will become more apparent from the following detailed description of the pres-

DESCRIPTION OF THE PREFERRED EMBODIMENTS

Example 1

Description is now made on Example 1 according to the first aspect of the present invention.

Figure 3:
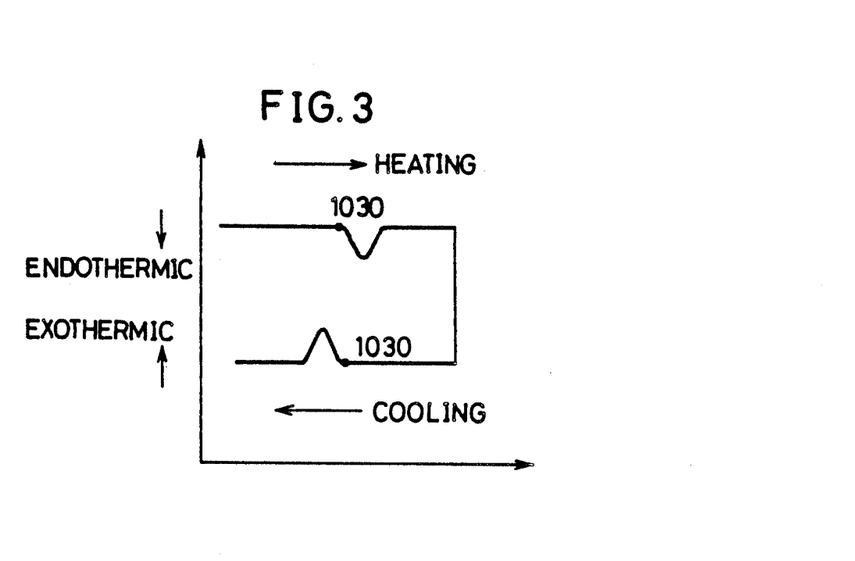
FIG. 3 illustrates the result of differential thermal analysis of a $YBa_2Cu_3O_{7-\delta}$ sintered material.

An oxide superconductor was prepared from $YBa_2Cu_3O_{7-\delta}$. FIG. 3 illustrates the result of differential thermal analysis of $YBa_2Cu_3O_{7-\delta}$. The leading edge of a temperature-up endothermic peak is 1030° C., and that of a temperature-down exothermic peak is also 1030° C.

Figure 4:
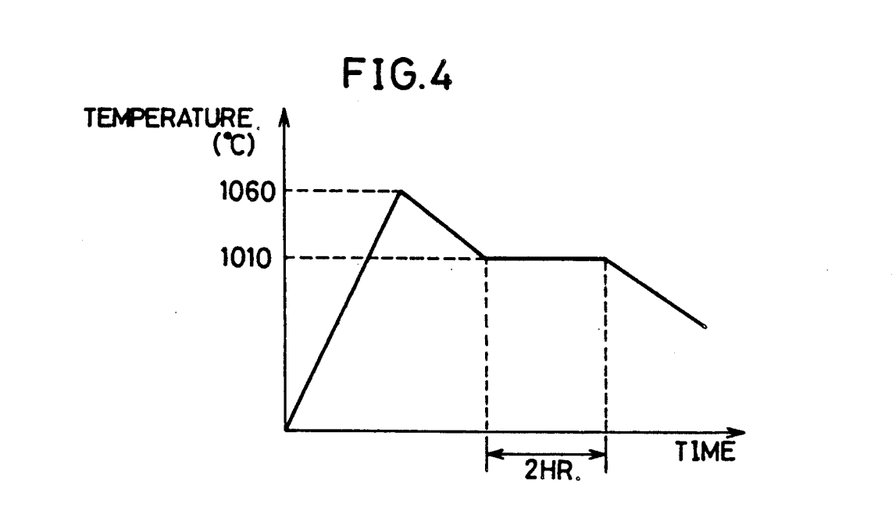
FIG. 4 illustrates a heating/cooling curve in Example according to the first aspect of the present invention.

Powder of $YBa_2Cu_3O_{7-\delta}$ prepared by a sintering method was introduced into a platinum crucible as a starting material, to be heated/molten in a furnace. Peritectic reaction was started at about 1030° C. in temperature-up operation. Upon completion of the peritectic reaction, the powder was heated to 1060° C., and then cooled at a cooling rate of 5° C./min. to the temperature for starting peritectic reaction. Thereafter the powder was retained at a constant temperature of 1010° C. in a temperature range with appearance of the exothermic peak in the differential thermal curve shown in FIG. 2 for two hours, and cooled at a rate of 5° C./min. FIG. 4 shows a heating/cooling curve of this Example.

A crystal obtained in the aforementioned manner was subjected to powder X-ray diffraction, to recognize that $YBa_2Cu_3O_{7-\delta}$ was obtained in a single phase. Further, its density reached 94% of a theoretical value, to provide excellent crystallinity.

Example 2

Description is now made on Example 2 according to the second aspect of the present invention, employing $YBa_2Cu_3O_{7-\delta}$ as an oxide superconductor and $SrTiO_3$ as a single crystal substrate.

First, a $YBa_2Cu_3O_{7-\delta}$ sintered powder was subjected to differential thermal analysis, to confirm that a differential thermal peak showing peritectic reaction was 1030° C.

Then, the aforementioned sintered powder was applied, through use of propylene glycol, on the (100) surface of the aforementioned single crystal substrate of 10×10 mm in size, which in turn was introduced into a furnace to be heated to 1060° C. under an oxygen atmosphere. Such heating was retained for one hour and then the temperature was reduced to 1010° C., at which the substrate was retained further for one hour to provide a superconducting thick film. Supply of oxygen during this operation was 6 l/hr. Then the film was slowly cooled at a cooling rate of 300° C./hr.

The $YBa_2Cu_3O_{7-\delta}$ superconducting thick film was 15 to 20 μm in thickness, and oriented at the (001) direction. The structure of this film was observed to confirm that its crystallinity was improved as compared with that obtained through solid phase reaction with excellent density reaching 94% of a theoretical value. Then, its superconductivity was examined to confirm that the film caused superconduction transition at a temperature exceeding the liquid nitrogen temperature, and its critical current density was 600 $A/cm^2$.

Reference example was prepared by the conventional method employing no peritectic reaction, to confirm that its critical current density was about 100 $A/cm^2$.

Example 3

Figure 5:
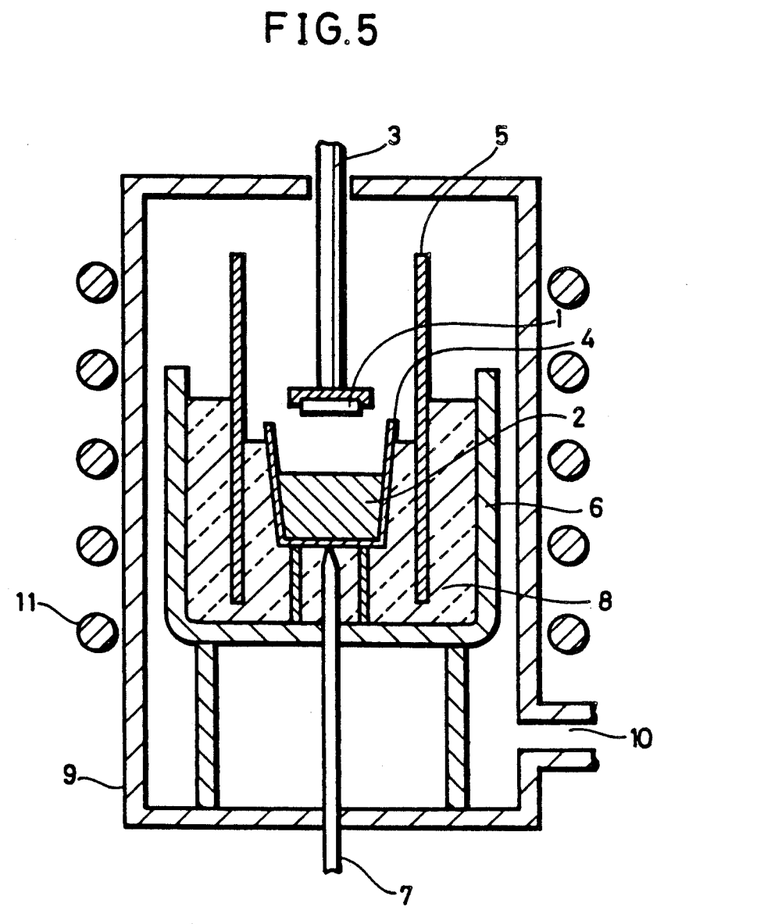
FIG. 5 is a sectional view showing an apparatus employed in Example according to a third aspect of the present invention.

Description is now made on Example 3 according to the third aspect of the present invention. FIG. 5 is a sectional view showing an apparatus employed in Example 3 according to the third aspect of the present invention. Referring to FIG. 5, a substrate 1 is mounted on a second end of an upper shaft 3. A raw material molten solution 2 is contained in a platinum crucible 4, and a cylindrical platinum heater 5 is provided around the crucible 4 through a heat insulator 8. The heat insulator 8 is further extended to also enclose the platinum heater 5. These elements are contained in an alumina vessel 6, which is placed in a central portion of an airtight vessel 9. A high-frequency heating coil 11 is provided on the exterior of the airtight vessel 9. The cylindrical platinum heater 5 is provided in order to avoid direct heating of the platinum crucible 4. The airtight vessel 9 is provided with an oxygen inlet 10, which is adapted to supply oxygen. A thermocouple 7 is provided in the bottom portion of the platinum crucible 4.

A ground mixture of $BaCuO_2$ and $CuO$ is introduced into the platinum crucible 4 and oxygen is supplied into the airtight vessel 9 to maintain an oxygen atmosphere, while the high-frequency coil 11 is energized to melt the raw material mixture. Then it is confirmed that the raw material molten solution is retained at a prescribed temperature by the thermocouple 7, and thereafter the upper shaft 3 is downwardly moved to dip a substrate of an $M_2BaCuO_5$ single crystal in the raw material molten solution. This state is held for a constant period, and then the temperature of the raw material molten solution is gradually reduced to form a prescribed thin film. Thereafter the upper shaft 3 is raised up and the temperature is reduced to an annealing temperature, which in turn is retained for a constant period to form a superconducting oxide thin film of $MBa_2Cu_3O_{7-\delta}$ on the substrate.

Example 3-1

The apparatus shown in FIG. 5 was employed to manufacture a thin film of $YBa_2Cu_3O_{7-\delta}$.

First, $Y_2O_3$, $BaCO_3$ and $CuO$ were molten and mixed in mole ratios Y:Ba:Cu=2:1:1 to be pelletized, sintered in the atmosphere at 900° C. for 12 hours, and ground. Powder thus obtained was introduced into an alumina crucible and heated up to 1400° C. to be molten, and then slowly cooled to the room temperature at a cooling rate of 5° C./min., thereby to obtain a $Y_2BaCuO_5$ single crystal. It was confirmed by a powder X-ray diffraction method that the crystal was simply composed of $Y_2BaCuO_5$. A substrate of 2 mm×2 mm×5 mm in size was cut from this crystal.

On the other hand, a raw material molten solution was prepared by mixing ground $BaCO_3$ and CuO in a mole ratio Ba:Cu=3:5, pelletizing the mixture, sintering the same in the atmosphere at 890° C. for 12 hours and grinding the same. It was confirmed by a powder X-ray diffraction method that powder thus obtained was a mixture of $BaCuO_2$ and CuO. It may be considered that the mixing ratio of $BaCuO_2$ to CuO was about 3:2, since an X-ray diffraction peak shows only phases of $BaCuO_2$ and CuO but no other phase, while both of Ba and Cu are substantially non-volatile. The powder was introduced into the platinum crucible, which was placed in the airtight vessel of Pyrex. Oxygen was introduced into the airtight vessel at a flow rate of 1 l/min. to maintain an oxygen atmosphere, and the high-frequency heating coil was energized to heat the raw material. It was observed that the surface of the raw material was completely molten when the thermocouple pointed a temperature of 1025° C. It has been confirmed through other experiments such as thermal analysis and X-ray diffraction that the raw material molten solution in this state was a mixed molten solution of $BaCuO_2$ and CuO. The upper shaft was downwardly moved while retaining the temperature of the thermocouple at 1025° C. to hold the substrate in a position immediately above the raw material molten solution with a space of 3 mm and to sufficiently heat the same, thereby to reduce temperature difference between the raw material molten solution and the substrate. Then, the upper shaft was further downwardly moved by 4 mm, to dip the substrate in the raw material molten solution. This state was maintained for 30 minutes, and then the raw material molten solution was cooled to 1005° C. at a temperature-down rate of 10° C./hr. Thereafter the substrate was gradually raised up to be held in a position immediately above the raw material molten solution with a space of 20 mm, and the temperature was reduced until the thermocouple pointed a temperature of 880° C., which temperature was stabilized and retained for five hours, thereby to anneal the substrate in the oxygen atmosphere. Supply of oxygen during this operation was 1 l/min. Thereafter the substrate was cooled to the room temperature at a cooling rate of 150° C./hr. and then taken out from the apparatus.

The color of the substrate was green in correspondence to the composition of $Y_2BaCuO_5$ before dipping in the raw material molten solution. However, the surface of the substrate was coated with a black thin film after annealing. This black thin film was subjected to structure analysis by X-ray diffraction, to confirm that the same was a polycrystal layer of $YBa_2Cu_3O_{7-\delta}$. Then, temperature dependence of electrical resistivity was measured by a general four-terminal method, to confirm superconductivity of Tc=82K and Jc=600 A/cm$^2$ at 4.2K. Further, the section was observed through an optical microscope, to confirm that a thin film of 5.3±0.8 μm in thickness was formed over the entire surface of the substrate of 2 mm×5 mm. The surface was observed through an electron microscope, to confirm that the film was formed by an extremely dense aggregate of fine polycrystals of 20 to 30 μm in particle size. It was confirmed from the result of weight change of DTA/TG measurement that the thin film of $YBa_2Cu_3O_{7-\delta}$ was of high quality with oxygen concentration of $\delta \approx 0.1$.

Example 3-2

An experiment similar to that in Example 3-2 was made by employing Er in place of Y.

As the result, a dense polycrystal thin film of $ErBa_2Cu_3O_{7-\delta}$ was formed on a single crystal substrate of $Er_2BaCuO_5$. In this thin film, Tc was 80K and Jc was 550 A/cm$^2$ at 4.2K.

Example 4

Description is now made on Example 4 according to the fourth aspect of the present invention.

Example 4-1

Figure 6:
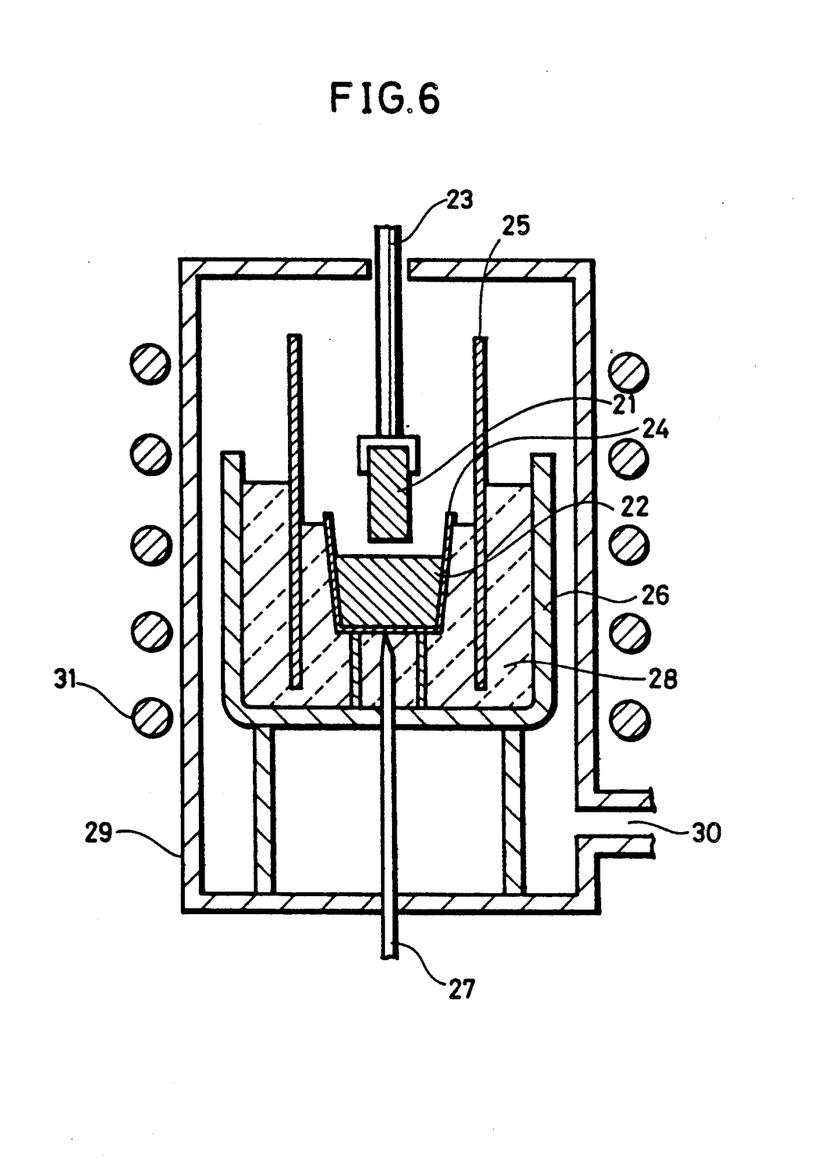
FIG. 6 is a sectional view showing an apparatus employed in Example according to a fourth aspect of the present invention.

FIG. 6 is a sectional view showing an apparatus for illustrating Example according to the fourth aspect of the present invention. Referring to FIG. 6, a sintered material 21 is mounted on a lower end of an upper shaft 23. A raw material molten solution 22 is contained in a platinum crucible 24, and a platinum heater 25 is provided around the platinum crucible 24 through a heat insulator 28. The heat insulator 28 is further extended to also enclose the platinum heater 25. These elements are contained in an alumina vessel 26, which is entirely placed in an airtight vessel 29. A high-frequency heating coil 31 is provided around the airtight vessel 29. The airtight vessel 29 is provided with an oxygen inlet 30, which is adapted to supply oxygen. A thermocouple 27 is provided on the bottom portion of the platinum crucible 24.

In this Example, the raw material molten solution 22 was prepared by mixing ground raw materials of $BaCO_3$ and CuO, pressing the mixture, sintering the same in the atmosphere at 890° C. for 12 hours and grinding the same. The materials were mixed in a mole ratio Ba:Cu=3:5 ($BaCuO_2$:CuO=3:2), and it was confirmed by a powder X-ray diffraction method that powder obtained through the grinding step was a mixture of $BaCuO_2$ and CuO.

The sintered material 21 was prepared by the following process. The mixture of $Y_2O_3$, $BaCO_3$ and CuO in mole ratios Y:Ba:Cu=2:1:1, are pelletized and sintered in the atmosphere at 900° C. for 12 hours, and grinding. Thereafter the powder are pelletized into a column of 10 mm in diameter and 25 mm in length and further sintering the column in the atmosphere at 1080° C. for five hours. It was confirmed by a powder X-ray diffraction method that the sintered material 21 was simply composed of $M_2BaCuO_5$.

The sintered material 21 and the raw material molten solution 22 prepared in the aforementioned manner were employed to manufacture a superconducting oxide in the apparatus shown in FIG. 6. The raw material powder was introduced into the platinum crucible 24 and heated by the high-frequency coil 31. The cylindrical platinum heater 25 is provided to avoid direct heating of the platinum crucible 24.

Oxygen was introduced into the airtight vessel 29 of Pyrex from the oxygen inlet 30 at a flow rate of 1 l/min., to provide an oxygen atmosphere in the airtight vessel 29.

The raw material contained in the platinum crucible 24 was heated in such an oxygen atmosphere. It was observed that the surface of the raw material contained in the platinum crucible 24 was completely liquefied when the thermocouple 27 pointed a temperature of 1025° C. It has been clarified by other experiments such as thermal analysis, X-ray diffraction and the like that this state is attained by melting of $BaCuO_2$ and CuO into liquid phases.

The upper shaft 23 was downwardly moved while retaining the thermocouple 27 at the temperature of 1025° C., and the sintered material 21 was held in a position immediately above the raw material molten solution 22 with a space of 3 mm for 20 minutes and sufficiently heated to reduce temperature difference between the raw material molten solution 22 and the sintered material 21. The sintered material 21 was held in this state for 30 minutes and then gradually raised up to be held in a position immediately above the raw material molten solution 22 with a space of 20 mm. Then the temperature was reduced at a cooling rate of 10° C./hr. until the thermocouple 27 pointed a temperature of 880° C., which temperature was then stabilized. The sintered material 21 was held in this state for five hours, to be annealed in the oxygen atmosphere. Thereafter the sintered material 21 was cooled to the room temperature at a cooling rate of 150° C./hr. to be taken out from the apparatus. Supply of oxygen during this operation was maintained at a flow rate of 1 l/min.

Before dipping in the raw material molten solution 22, the sintered material 21 was a green substance having composition of $Y_2BaCuO_5$. However, it was changed into a black substance through the aforementioned process. It was confirmed through structure analysis by an X-ray diffraction method that the black substance was a superconductive oxide of $YBa_2Cu_3O_{7-\delta}$.

Temperature dependency of electrical resistivity was measured by a general four-terminal method, to observe superconductivity of Tc=82K and Jc=1050 A/cm$^2$ at 4.2K. The section was polished for observation through an electron microscope, to confirm that the superconducting oxide was extremely densely filled with fine crystals of 30 to 70 $\mu$m in particle size. Element composition ratios analyzed by EDX were Y:Ba:Cu=1:2:3, and it was confirmed that this substance was composed of $YBa_2Cu_3O_{7-\delta}$.

Example 4-2

A superconducting oxide was manufactured in a similar manner to Example 4-1 by a similar apparatus, except for that a sintered material was prepared from a wire rod of 2 mm in diameter and 80 mm in length in place of the cylindrical sintered material. The raw material molten solution, the composition of the sintered material and the like were identical to those of Example 4-1.

It was confirmed through an X-ray diffraction method that the wire rod obtained in this Example was changed into a superconductive oxide of $YBa_2Cu_3O_{7-\delta}$. Temperature dependence of electrical resistivity was measured by a four-terminal method, to confirm superconductivity of Tc=80K and Jc=780 A/cm$^2$ at 4.2k.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an oxide superconductor comprising the steps of:
   (a) dispersing a powder of a raw material for an oxide superconductor comprising $MBa_2Cu_3O_{7-\delta}$, wherein M represents at least a single element selected from the group consisting of Y, Nd, Sm, Eu, Gd, Dy, Ho, Er, Tm, Yb and Lu, in a dispersion medium to form a dispersion;
   (b) then applying the dispersion onto a substrate;
   (c) then heating the dispersion under an oxygen atmosphere to a temperature from 0° to 100° C. higher than the peritectic reaction temperature of said dispersion to form a molten solution, wherein said peritectic reaction temperature is within a range ±30° C. of a rise temperature of a differential thermal peak of said powder;
   (d) then cooling said molten solution to said peritectic temperature;
   (e) then maintaining said molten solution at said peritectic temperature for about 1 to 20 hours; and
   (f) then cooling said molten solution at a rate of not more than 300° C./hour to room temperature.

2. A method of manufacturing an oxide superconductor comprising the steps of:
   (a) dispersing a powder of a raw material for an oxide superconductor comprising $M_2O_3$, $BaCO_3$ and CuO, where M represents at least a single element selected from the group consisting of Y, Nd, Sm, Eu, Gd, Dy, Ho, Er, Tm, Yb and Lu, in a dispersion medium to form a dispersion;
   (b) then applying the dispersion onto a substrate;
   (c) then heating dispersion under an oxygen atmosphere to a temperature from 0° to 100° C. higher than the peritectic reaction temperature of said powder to form a molten solution, wherein said peritectic reaction temperature is within a range ±30° C. of a rise temperature of a differential thermal peak of said powder;
   (d) then cooling the molten solution to the peritectic temperature,
   (e) then maintaining said molten solution at said peritectic temperature for about 1 to 20 hours; and
   (f) then cooling said molten solution at a rate not more than 300° C./hour to room temperature.

3. A method of manufacturing an oxide superconductor according to claim 1 or 2, wherein said substrate is prepared from a single crystal member of MgO, YSZ or $SrTiO_3$.

4. A method of manufacturing an oxide superconductor according to claim 1 or claim 2, wherein in step (b) said powder is heated to 30° C. higher than said peritectic reaction temperature to form a molten solution.

5. A method of manufacturing an oxide superconductor comprising the steps of:
   (a) heating a mixture of $BaCuO_2$ and CuO under an oxygen atmosphere to a temperature above the peritectic solidification temperature at which the following reaction proceeds $M_2BaCuO_5$ (solid phase)+Ba-Cu oxides (liquid phase) →$MBa_2Cu_3O_{7-\delta}$ (solid phase)

to form a molten solution, wherein M represents at least a single element selected from the group consisting of Y, Nd, Sm, Eu, Gd, Ho, Er, Tm, Yb and Lu, and said peritectic solidification temperature is measured by differential thermal analysis;
   (b) then dipping a substrate composed of $M_2BaCuO_5$, in the molten solution;
   (c) then cooling the molten solution to a temperature 0° to 100° C. below said peritectic solidification temperature and maintaining said temperature for 5 minutes to 10 hours;

(d) then cooling the substrate to room temperature at a rate of 5°–150° C./hour to form an oxide superconductor $MBa_2Cu_3O_{7-\delta}$.

6. A method of manufacturing an oxide superconductor according to claim 5, further comprising a step of annealing said oxide superconductor in an oxygen atmosphere at a temperature of 850° to 900° C. for at least three hours.

7. A method of manufacturing an oxide superconductor according to claim 5, wherein step (a) comprises a step of employing a mixture obtained by mixing $BaCuO_2$ and $CuO$ in a mole ratio 3:2.

8. A method of manufacturing an oxide superconductor according to claim 5, wherein said substrate is a single crystal of $M_2BaCuO_5$.

9. A method of manufacturing an oxide superconductor according to claim 5, wherein said substrate is a porous sintered material of $M_2BaCuO_5$.

10. A method of manufacturing an oxide superconductor according to claim 9, wherein said sintered material is formed by particles of not more than 0.5 µm in particle size.

11. A method of manufacturing an oxide superconductor according to claim 9, wherein said sintered material has a porosity of 5 to 30%.

12. A method of manufacturing an oxide superconductor according to claim 9, wherein in step (c) the molten solution is cooled to 900° to 1100° C.

* * * * *